United States Patent [19]

Martin

[11] 4,427,711
[45] Jan. 24, 1984

[54] A METHOD FOR SENSING DEPOSITION OF A THIN FILM LAYER OF A MATERIAL

[75] Inventor: Richard T. Martin, Santa Barbara, Calif.

[73] Assignee: Applied Magnetics Corporation, Goleta, Calif.

[21] Appl. No.: 417,679

[22] Filed: Sep. 13, 1982

Related U.S. Application Data

[60] Division of Ser. No. 267,038, May 26, 1981, which is a continuation-in-part of Ser. No. 232,842, Feb. 9, 1981, Pat. No. 4,373,470.

[51] Int. Cl.³ ............................................. C23C 13/00
[52] U.S. Cl. ................................. 427/10; 427/248.1; 427/282
[58] Field of Search ............... 118/712, 663, 723, 665, 118/721, 715, 664, 686, 688, 689, 690; 427/9, 10, 248.1, 282

[56] References Cited

U.S. PATENT DOCUMENTS

| | | | |
|---|---|---|---|
| 3,238,918 | 3/1966 | Radke et al. | 118/720 |
| 3,570,449 | 3/1971 | Blecherman et al. | 118/712 |
| 3,667,424 | 6/1972 | cornelius et al. | 118/720 |
| 3,747,558 | 7/1973 | Harel | 118/721 X |
| 3,799,800 | 3/1974 | Thelen et al. | 927/10 |
| 4,049,352 | 9/1977 | Lardon et al. | 118/712 X |

Primary Examiner—John D. Smith
Assistant Examiner—Bernard F. Plantz
Attorney, Agent, or Firm—Daniel J. Meaney, Jr.

[57] ABSTRACT

Apparatus for sensing deposition of a thin film layer of a material from a source onto a substrate having a carriage assembly including a predetermined number of apertures for selectively passing predetermined portions of a material from the source along each of a plurality of predetermined paths located in the proximity of the substrate under conditions correlated to that under which the material is deposited through a deposition path onto the substrate, inhibiting elements positioned relative to the carriage assembly for selectively inhibiting passage of predetermined portions of the material through a selected number of the predetermined number of the apertures, and a monitor for monitoring a selected parameter of the thin film material which is passed through other than the selected number of apertures of the carriage assembly wherein the monitor includes a plurality of detectors one of each of which is positioned along one of the plurality of predetermined paths and being adapted to sense a predetermined portion of a thin film material being passed along its associated predetermined path and for producing electrical signals derived from the selected parameter representating at least one of the mass per unit area, thickness and deposition rate of the thin film material is shown. A method for measuring at least one of the mass per unit area, thickness and deposition rate of a thin film layer being deposited through a deposition mask selected from a plurality of deposition masks adapted to be positioned between a substrate and a source is also shown.

4 Claims, 14 Drawing Figures

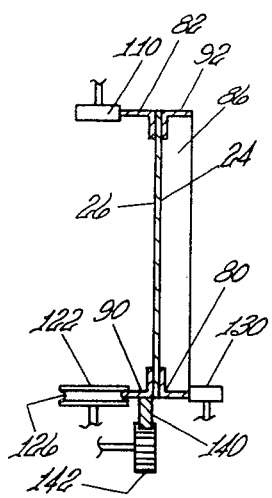
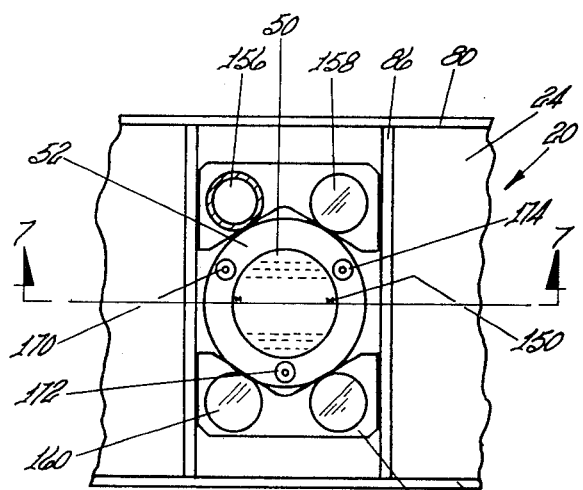
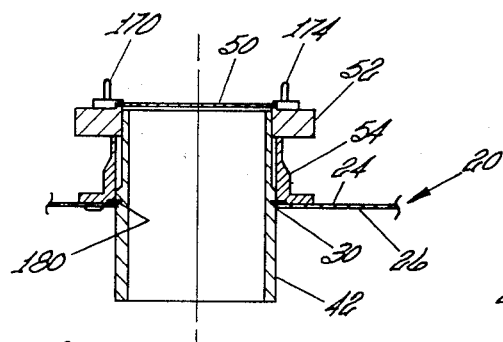
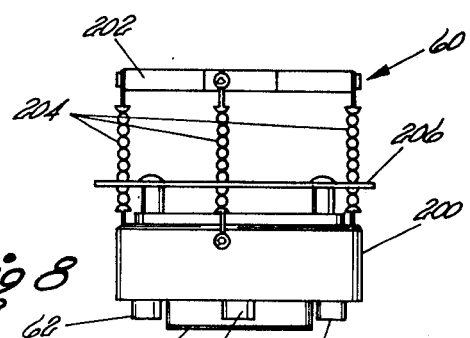
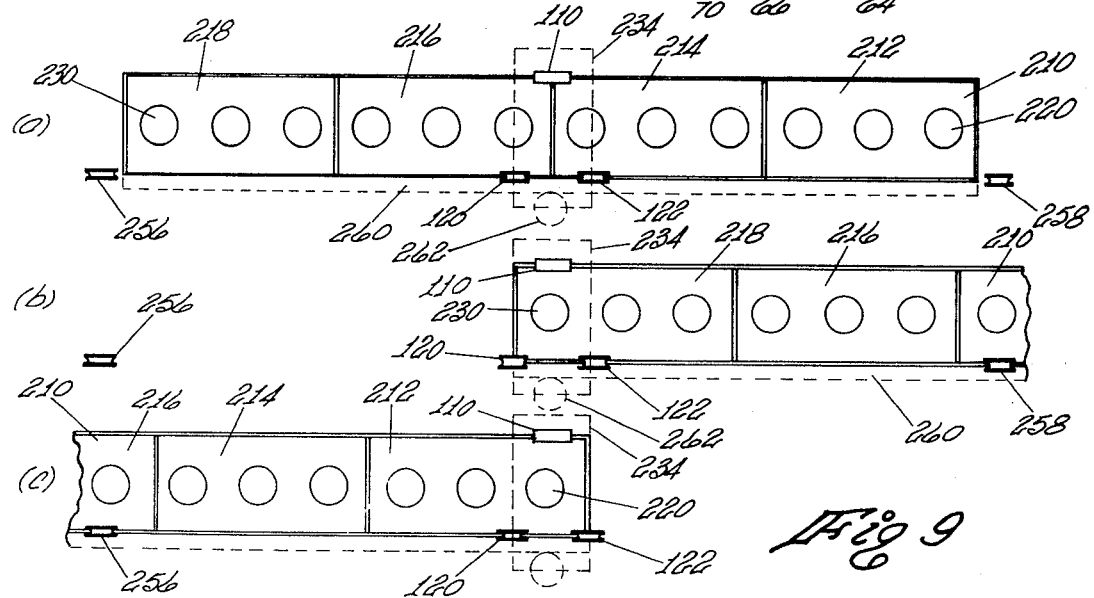

A METHOD FOR SENSING DEPOSITION OF A THIN FILM LAYER OF A MATERIAL

This is a division of application Ser. No. 06/267038, filed May 26, 1981 which is a continuation-in-part of application Ser. No. 232,842 filed Feb. 9, 1981 now U.S. Pat. No. 4,373,470 and assigned to the assignee of this application.

BACKGROUND OF THE INVENTION

1. Field of the Invention

This invention relates to apparatus and a method for sensing deposition of a thin film layer of a material from a source onto a substrate and more particularly applies to an apparatus and method for sensing the mass per unit area, thickness or deposition rate of a thin film formed of one or more layers of material being deposited on a selected surface of a substrate in a vapor deposition process utilizing one or more of a plurality of detecting means in a preselected array.

2. Description of the Prior Art

There are several known techniques in the prior art for measuring the mass per unit area or thickness of a thin film layer of material being applied to a substrate.

It is known in the prior art to utilize a thin film detector having a detecting surface positioned to intercept a portion of the material being emitted from the sources such that the detecting surface and substrate surface have a thin film layer of material deposited thereon under similar conditions. By monitoring the mass per unit area, thickness or deposition rate of the material being applied to the detecting surface, the mass per unit area or thickness of the thin film layer of material being applied to a selected surface of a substrate can be monitored and controlled.

One known method of measurement of evaporated film thickness during evaporation has been accomplished using optical devices for optically sensing the thickness of a thin film on a detecting surface. Further, it is known in the art to change the resonance frequency of a piezoelectric crystal which occurs during formation of a film of material on the surface of the piezoelectric crystal.

Another known prior art method is to measure the resistance of a thin film conductive layer as it is formed on the substrate or a detecting means surface. The resistance of the thin film layer of material varies in magnitude as a function of the thickness of the thin film of material.

It is also known in the art to measure vapor concentration of the material being evaporated. Certain of the prior art systems utilize a mechanical chopper for modulating the beam of evaporating material so that it can be separately measured from the effect of the residual gas within the vacuum chamber in the deposition process.

In addition, a number of known systems are commercially available for measuring the thickness of a film of material applied to a substrate. One such system utilizing a piezoelectric crystal is offered for sale and sold by Sloan Technology of Santa Barbara, Calif. under the name "DTM" Monitoring System. Another such system utilizing the vapor concentration techniques is offered for sale and sold by Leybold-Heraeus, East Syracuse, N.Y. under the name "INFICON Sentinel 200" deposition controller.

SUMMARY OF THE INVENTION

The present invention discloses an apparatus for sensing deposition of a thin film layer of a material from a source onto a substrate. In the preferred embodiment, means including means for defining a predetermined number of apertures for selectively passing predetermined portions of a material from a source along each of a plurality of predetermined paths located in the proximity of a substrate is provided. The material being passed along the predetermined paths are passed under conditions correlated to that under which a material is deposited through a deposition path in a thin film layer onto a substrate. Means are positioned relative to the selectively passing means for selectively inhibiting passage of a predetermined portion of the material through each of a selected number of the predetermined number of apertures. Means for monitoring a selected parameter of a thin film material which is passed through other than the selected number of predetermined number of said apertures of the selectively passing means are provided. The monitoring means including detecting means are positioned along each of the plurality of predetermined paths and are adapted to sense a predetermined portion of the thin film material being passed along its associated predetermined path and for producing electrical signals derived from the selected parameter of the thin film material so detected representing at least one of the mass per unit area, thickness and deposition rate of a said thin film of material.

In the known prior art devices, the use of optical procedures relies upon the variable optical density of a collected film and does not provide a precise measurement of mass per unit area or thickness of a thin film to the level desired for the advanced technology of the thin film deposition of layers for electrical components such as for example the fabrication of thin film magnetic heads. These and other known devices do not avail themselves to optical sensing techniques since the deposited films are often opaque and too thick for such techniques.

The use of a piezoelectric quartz crystal which changes its resonance frequency in and of itself does not provide the desired accuracy for measuring the thickness of a plurality of thin film layers of different materials which are generally required in connection with the fabrication of electronic devices because the variation in frequency to film thickness is nonlinear and dependent upon the characteristics of each of the materials so deposited. If the material deposited on the crystal surface is homogeneous, it is possible to mathematically compensate for the non-linearity effects to obtain accurate measurements. If the material deposited on the crystal surface is non-homogeneous mixed thin film layers of different materials it is very difficult to compensate for the non-linearity resulting in order to obtain accurate measurements.

Another disadvantage of the prior art devices is that as the net thickness of various layers of material accumulates on the crystal surface, a limitation is reached as to the maximum thickness of material that can be deposited on the crystal with reliable response.

In a multi-vapor deposition process, it is possible to exceed the thickness range of a detector being used for the process before the process is completed.

The quantity of material which reaches a single detector can be reduced by use of a mechanical chopper to interrupt the beam of evaporating material. The use of a chopper for modulating the beam of evaporating material results in additional mechanical components being positioned within the chamber.

The combination of a detector and a mechanical chopper does not provide an accurate means for monitoring a plurality of different materials which could be deposited on a substrate. If a two stage modulator is used for depositing two layers of different material on a substrate through one mask, a shutter mechanism must be used. Use of a shutter mechanism means results in additional apparatus and cost.

Another disadvantage of the prior art devices is that in a multi-step vapor deposition process, it is necessary to have independent monitoring systems for each material and means including mechanical shuttering for selecting the appropriate monitoring crystal or device associated with the material and which must be programmed into the deposition process.

An additional disadvantage of the prior art measuring systems is that the fabrication of present state of the art electronic components using vapor deposition techniques result in layers of material having a thickness which substantially equal or exceed the thicknesses which can be reliably measured using a single crystal detector.

One advantage of the present invention is that a plurality of piezoelectric crystal detector devices, compatible to the process itself can be utilized and at least one crystal detector can be assigned to each specific evaporation material. Thus, in a multi-step vapor deposition process utilizing several different materials, a specific selected crystal detector can be utilized for each specific type of evaporation material and the crystal detector dedicated to that type of evaporation material can precisely measure the thickness and weight of a thin film layer thereof deposited on a substrate during a vapor deposition.

Another advantage of the present invention is that the net thickness of material deposited on each detector surface individually is reduced due to the fact that a plurality of detectors are utilized to receive material normally deposited on a single detecting surface. This results in a decrease of non-linearity measurement problems arising from mixed or non-homogenous layers of material and also helps avoid exceeding the maximum thickness range of the detector.

Yet another advantage of the present invention is that by use of an elongated supporting frame, a plurality of monitoring apertures can be formed around the aperture through which the deposited material passes to a selected substrate so that a predetermined quantity of material is deposited on a selected crystal detector surface under substantially the same conditions as that material is deposited to form the thin film layer on the selected substrate. If a substrate is to have a plurality of thin film layers of different materials formed thereon, a selected different crystal detector can be utilized and dedicated to each material which is formed into a thin film layer.

A yet further advantage of the present invention is that by use of a simple mechanical inhibiting means, an elongated supporting frame can be mechanically programmed such that at each step of the vapor deposition process, a crystal detector associated with the material being vapor deposited can be utilized so that a precise thickness and weight of the thin film layer of material can be controlled. The same selected crystal detector would be used each time its associated material is deposited on a thin film substrate.

A further advantage of the present invention is that the carriage assembly includes inhibiting means in the form of capping devices to prevent other detectors from receiving unwanted material. In addition, the capping devices prevent buildup or contamination of the other crystals detectors with undesired material from other process steps.

A still yet further advantage of the present invention is that a monitoring means includes a plurality of detectors in a predetermined array and includes means for producing an information signal representing at least one of the mass per unit area, thickness or deposition rate of a thin film layer of material for each of the detectors in the array.

Yet another advantage of the present invention is that a programming control means responsive to a monitoring means produces a control signal which is utilized to control passage of a vapor deposition material along a deposition path to obtain desired mass per unit area, thickness or deposition rates and includes an indication means for indicating the same.

A yet further advantage of the present invention is that the apparatus and method of the present invention can be utilized in a multi-stage elongated supporting frame having a plurality of masks and where a selected detector is associated with a specific mask forming an inherently programmed detector selection device for use in a multi-step deposition process.

BRIEF DESCRIPTION OF THE DRAWING

The foregoing and other advantages and features of this invention will become apparent from the following description of the preferred embodiment, when considered together with the illustrations and the accompanying drawing which includes the following Figures:

FIG. 5 is an end sectional view of the elongated mask supporting frame taken along section lines 5—5 of FIG. 3;

FIG. 6(a) is a partial top plan view of one aperture within the elongated mask supporting frame having a mask supported therein;

FIG. 6(b) is a pictorial representation of an alignment target illustrated in FIG. 6(a) to afford precise alignment between selected masks;

FIG. 7 is a partial front sectional view of an elongated mask supporting frame having a selected mask and a shield tube mounted therein;

FIG. 8 is a front plan view of that portion of the means located on a gantry for accurately registering a substrate relative to an indexed mask;

FIGS. 9(a), (b) and (c) illustrate diagrammatically a mask support assembly having a plurality of apertures which are adapted to support masks, a single support roller; two pair of guide rollers and a means for driving the elongated mask supporting frame along a path which is substantially parallel to the direction of elongation thereof and wherein FIG. 9(a) shows the elongated mask supporting frame in a center position; FIG. 9(b) shows the same in the far right position; and FIG. 9(c) shows the same in the far left position, respectively;

DESCRIPTION OF THE PREFERRED EMBODIMENT

Figure 1:
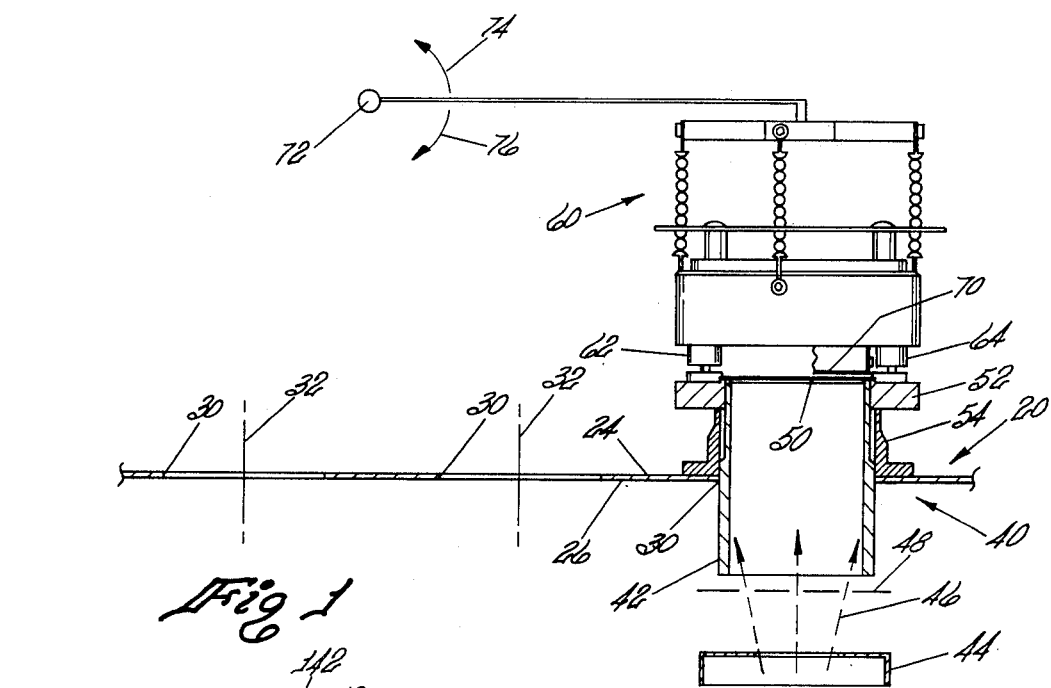
FIG. 1 is a plan side view partially in schematic, showing the floor of the carriage means which includes the carriage assembly, means for supporting a mask within an aperture of the elongated mask supporting frame and means in the form of a gantry for accurately registering a substrate to an indexed selected mask positioned at a working station.

FIG. 1 discloses a means for supporting one mask from a plurality of masks relative to a work station. In its broadest aspects, the supporting means includes a carriage assembly which includes a means comprising an elongated mask support means such as an elongated mask supporting frame 20 having an upper surface 24 and a lower surface 26. The elongated mask supporting frame 20 includes means for defining a plurality of apertures 30 which extend to the upper surface 24 and the lower surface 26. Each aperture 30 has a predetermined diameter and a preselected spacing between the centers 32 of each aperture. Each of the apertures 30 can be adapted to have a mask positioned therein as illustrated at work station 40. This structure is generally referred to as means adapted for positioning each of the masks in a predetermined position relative to each other. The longitudinal axis of the elongated mask supporting frame is in the direction thereof. This lateral axis of the elongated mask supporting frame is in a direction perpendicular to the longitudinal axis and in a plane parallel to the plane of the aperture defined by the elongated mask supporting frame.

In the preferred embodiment, aperture 30 at work station 40 has a vapor deposition tube member 42 having one end thereof which is positioned relative to a source 44. In the preferred embodiment, source 44 is a source of vapor deposition material which emanates from the source 44 along the path indicated by dashed Arrows 46. The vapor deposition passes through the mask shield 42 and a mask 50 which is supported by a mask support assembly 52. The elongated mask supporting frame includes a mask supporting housing 54 for fixedly securing the vapor deposition tube member 42 and the mask support assembly 52 having the mask therein such that indexing of the mask 50 to the work station positions the mask in substantial alignment with the source 44.

After the elongated mask supporting frame 20 indexes mask 50 at the work station, a means for accurately registering a substrate, shown generally as gantry assembly 60, and which includes alignment means 62 and 64 accurately registers substrate 70 located on the gantry support means 60 relative to the mask 50.

As illustrated in FIG. 1, the gantry means for registering the substrate relative to the mask assembly and mask 50 is in an operative position. However, the gantry means is adapted to be rotated and pivot point 72 in a counter clockwise direction as shown by dashed arrow 74 to raise and withdraw the substrate 70 from its position in accurate registration with the mask 50. Of course, other means may be used to withdraw the gantry with the substrate from the mask.

With the gantry means in the raised position, the elongated mask supporting frame 20 is then driven to transport a different mask, which may have any selective pattern, into the working station 40. After a different mask is indexed to the work station 40, the gantry registration means 60 is then rotated in a clockwise direction shown by dashed arrow 76 causing the registration means 62 and 64 of the gantry means to accurately register the substrate 70 relative to a different mask then positioned at the work station. The registration means may be any appropriate mechanism to insure alignment between the gantry and mask. In the preferred embodiment, a pin and pin receiving socket is utilized.

Figure 2:
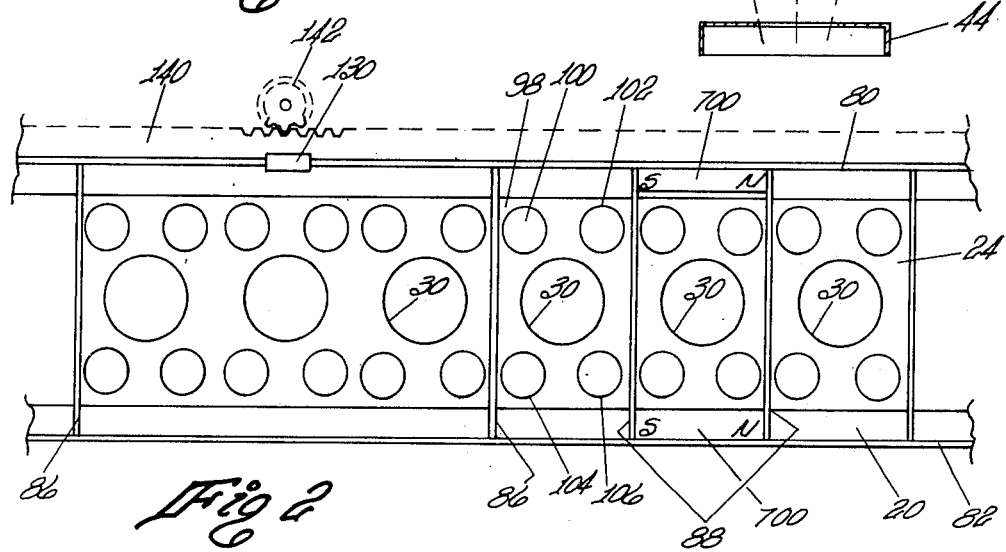
FIG. 2 is a top plan view showing an elongated mask supporting frame, the apertures formed therein and the translatably supported tooth rack and coupling gear for driving the elongated mask supporting frame including magnets for specific applications.

FIG. 2 shows one embodiment of a means for selectively indexing one mask from a plurality of masks relative to a work station. The carriage assembly illustrated in FIG. 2 includes elongated mask supporting frame 20 having an upper surface 24 and a lower surface 26 which is shown in greater detail in FIGS. 4 and 5.

In the broadest aspect, the elongated mask support means includes means for defining a guiding element and supporting element for the elongated mask support means. In the preferred embodiment, the elongated mask supporting frame has means defining a guiding element and supporting element in the form of a pair of spaced parallel generally elongated support rails 90 and 92 and which are located and extend along the periphery of the lower surface of the elongated mask supporting frame 20.

The elongated mask supporting frame 20 includes means for defining the pluralities of apertures 30 which are adapted to receive a mask assembly positioned therein. The apertures 30 extend through the upper surface to the lower surface of the elongated mask supporting frame 20. In FIG. 2, the elongated mask supporting frame is shown to have cross members 86 which may be applied hereto to provide additional structural rigidity to the elongated mask supporting frame 20.

The elongated mask supporting frame 20 includes means for defining a mask supporting surface, which in the preferred embodiment, is in the form of a pair of spaced, parallel, generally elongated side walls 80 and 82 extending along the periphery of the surface of the elongated mask supporting frame 20 defining a mask supporting means. The side walls 80 and 82 are in opposed alignment with the elongated support rails 90 and 92.

In addition to the mask receiving apertures 30, each mask position has in the preferred embodiment, four monitoring tube apertures 100, 102, 104 and 106 which are illustrated for mask position 98.

Figure 3:
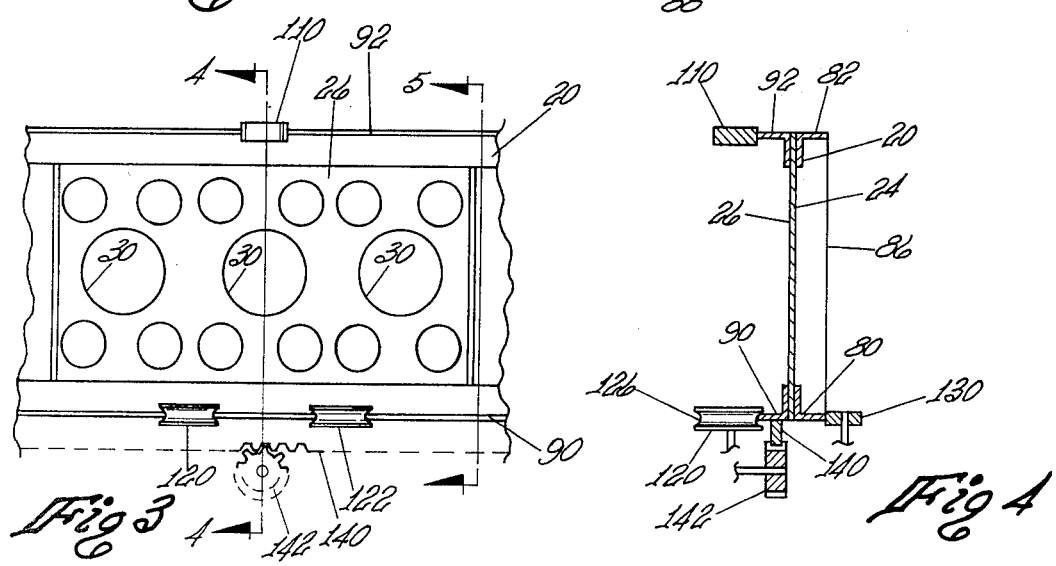
FIG. 3 is a bottom plan view showing three apertures having a predetermined diameter and a preselected spacing between the centers thereof and wherein a pair of central guide rollers and a support roller for providing the equivalent of a three point center support and suspension is shown.
Figure 4:
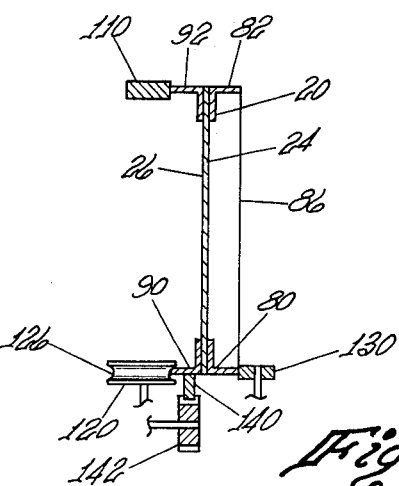
FIG. 4 is a sectional end view of the elongated mask supporting frame taken along section lines 4—4 of FIG. 3.

FIG. 3 illustrates the elongated mask supporting frame with an aperture for a mask indexed to a working station. In the bottom view of FIG. 3 is illustrated also a pair of central guide rollers 120 and 122, each of which have an outer grooved recessed rail receiving surface illustrated as grooved recessed rail receiving surface 126 in FIG. 4. The central guide rollers 120 and 122 are adapted to engage, guide and dynamically support the rail 90 of the pair of rails as the elongated mask supporting frame 20 is conveyed along a path which is substantially parallel to the direction of elongation thereof. Each of the central guide rollers 120 and 122 are adapted to rotate about an axis which is substantially normal to the direction of elongation of the elongated mask supporting frame 20 and each of which are parallel to and in alignment with the axis of a support roller 110. In the preferred embodiment, the axes of the central guide rollers are positioned equidistantly one on each side of the axis of the support roller 110. Each of the guide rollers 120 and 122 are adapted to have the grooved recessed rail receiving surface 126 as illustrated in FIG. 4, which is adapted to rotatably engage the rail 90 which is the other of the pair of rails, to maintain the same in a fixed position within the recessed groove 126 during conveyance of the elongated mask supporting frame.

Referring again to FIG. 3, a support roller 110 having an outer cylindrical roller bearing surface and a selected axial length is adapted to engage and dynamically rotatably support one of the pair of rails such as rail 92 in order to support the mask support assembly in the elongated mask supporting frame 20 as it is conveyed along a path which is substantially parallel to the direction of elongation of the elongated mask supporting frame 20. Support roller 110 defines a means for supporting the elongated mask supporting frame 20, through a means for defining a supporting element such as rail 92. In use, the support roller 110 is adapted to rotate about an axis which is substantially normal to the direction of elongation of the elongated mask supporting frame 20. The support roller 110 outer rail bearing surface must have a width to accommodate the lateral thermal expansion of the elongated mask supporting frame, e.g., the outer cylindrical rail bearing surface has a width parallel to the elongated mask supporting frame which is at least equal to the width of the rail 92 carried thereby plus any variations in the elongated mask supporting frame due to thermal expansion and contraction. In essence, the edge of rail 92 engages the outer cylindrical rail bearing surface which is in parallel alignment with the support roller axis.

As noted herein, at least one of the movably engaging means or the means defining a guiding elment includes a recessed groove and the other includes a protruding lip. In the preferred embodiment, the protruding lip is located on the elongated mask supporting frame and the recessed groove on the central guide roller. However, the recessed groove could be located on the elongated mask supporting frame and the protruding lip on the surface of the central guide roller. Either variation thereof may be used in practicing this invention.

As illustrated in FIG. 3, with the elongated mask supporting frame in a center position, the central guide rollers 120 and 122 and the support roller 110 provide the equivalent of a three point suspension and support. As the elongated mask supporting frame 20 is exposed to a thermal environment, as experienced in a vapor deposition process, the length and width thereof will increase due to thermal expansion. The rail 90 is essentially confined by the outer grooved recessed rail receiving surface 126 of each central guide roller 120 and 122 such that movement thereof is along the line of reference. This variation in width of the elongated mask supporting frame 20 results in rail 92 moving laterally along the outer cylindrical rail bearing surface of support roller 110.

Variations in length of the elongated mask supporting frame are accommodated by rail 90 moving relative to the outer, grooved recessed rail receiving surface of each central guide roller 120 and 122.

As shown in FIG. 3, the elongated mask supporting frame 20 is supported by the support roller 110 and central guide rollers 120 and 122. One example thereof is shown in greater detail in FIG. 9(a) when the elongated mask supporting frame is in centered position. When the elongated mask supporting frame is off center position, the elongated mask supporting frame engages and is supported by remote guide rollers 256 and 258 as illustrated in FIGS. 9(b) and 9(c).

When the center of gravity of the elongated mask supporting frame is located within a stabilized triangular area formed by the rail contact points in support roller 110 and central guide rollers 120 and 122, the equivalent three point suspension and support is provided by support roller 110 and central guide rollers 120 and 122. When the center of gravity is located at positions other than within the above described stabilized triangular area, the equivalent three point suspension and support is provided by the support roller 110 and by at least one centered guide roller 120 or 122 and one remote guide roller 256 or 258. This is discussed in greater detail in connection with FIGS. 9(a), 9(b), and 9(c). The effect of the relationship between the support roller 110 of FIG. 3 and the central guide rollers 120 and 122 is to form an equivalent three point suspension and support which concurrently holds the elongated mask supporting frame 20 in position relative to a fixed reference line essentially independent of the variations in physical characteristics while affording transportation of the same. One inherent relationship exists in the equivalent three point suspension and support system, that is, the center of gravity of the elongated mask supporting frame must be maintained within the area defined by the stabilized triangular area between the center lines of the axes of the central guide rollers 120 and 122, otherwise the elongated mask supporting frame 20 will tilt off of the three point suspension system.

In order to prevent or inhibit the above, a means for inhibiting separation of the elongated mask supporting frame 20 from the supporting means, the support roller 110, and the guide means, e.g. the central guide rollers 120 and 122 is needed.

One such separation inhibiting means may be a second set of remotely located guide rollers such as remote guide rollers 256 and 258 illustrated in FIG. 9. The construction of the remote guide rollers 256 and 258 are similar to the pair of central guide rollers 120 and 122 and are positioned one on each side of and in alignment with the pair of central guide rollers 120 and 122. When the elongated mask supporting frame 20 is in its centered position the remote guide rollers 256 and 258 as illustrated in FIG. 9(a) are positioned just off the ends of the elongated mask supporting frame 20.

When the elongated mask supporting frame 20 is transported in either direction relative to the pair of central guide rollers 120 and 122, the remote guide rollers 256 or 258 located in the direction of movement will engage the end of the elongated mask supporting frame 20. As the center of gravity of the elongated mask supporting frame 20 shifts to a position between one of the central guide rollers 120 or 122 and one of the remote guide rollers 256 or 258, an equivalent three point suspension and support system is developed between one or both of the central guide rollers 120 or 122, one of the remote guide rollers 256 or 258 and the support roller 110. Thus, at any transported position and independent of the length, width, or distortion of the elongated mask supporting frame 20, a three point suspension and support exist to prevent the elongated mask supporting frame from falling off of the rollers while being referenced to a reference line which extends through the grooved edges of all of the central guide rollers 120 and 122 and the remote guide rollers 256 and 258.

In addition to variations in width and length experienced by the elongated mask supporting frame 20, the elongated mask supporting frame 20 experiences warpage in the form of crook, bowing and twisting or combinations thereof. For purposes hereof, the term "crook" shall mean curvature of the elongated mask supporting frame about an axis which is substantially normal to a plane defined by the longitudinal and lateral axes of the elongated mask supporting frame with the curvature being located with such plane. The term "bow" shall means curvature of the elongated mask supporting frame, about an axis parallel to the lateral axis and located away from the nominal plane defined by the longitudinal and lateral axes of the elongated mask supporting frame. The term "twist" shall mean skewing of opposite edges of the elongated mask supporting frame.

When a crook type warpage occurs and one of the remote guide rollers 256 and 258 in FIG. 9(a) engage the rail 90 of the elongated mask supporting frame, rail 90 will ride upon the grooved recessed rail receiving surface 126 of the central guide roller 120 shown in FIG. 4, but the rail 90 will be held in position by the edges of the grooved recessed rail receiving surface 126. The relationship between the rail 90 and groove of central guide roller 122 would be the same except that the edge of rail 90 would engage the opposite side of the groove of the central guide roller 122.

Referring again to FIG. 2, in the alternative, the separation inhibiting means may be a loaded clamping roller.

In the preferred embodiment, a loaded clamping roller 130 having an outer cylindrical sidewall bearing surface engages and dynamically clamps the sidewall 80 illustrated in FIG. 4, as the elongated mask supporting frame 20 is conveyed along a path which is substantially parallel to the direction of elongation thereof. The loaded clamping roller 130 is adapted to rotate about an axis which is substantially normal to the direction of elongation of the elongated mask supporting frame 20. In addition, the axis of the loaded clamping roller 130 is spaced in parallel alignment with the axis of the central guide rollers 120 and 122 and is equidistant the central guide rollers of axis 120 and 122.

Referring again to FIG. 4, the central guide roller 130 is spaced from the central guide roller 120. The spacing is such that, one edge of the rail 90 of the pair of rails is located in the recessed groove 126 of the central guide roller 120 and the edge of the loaded clamping roller 130 engages the edge of one of the side walls 80 of the pair of sidewalls. The distance between the center of the recessed groove 126 and the edge of the surface of the loaded clamping roller is substantially equal to the geometrical dimension between the outer edges of rail 90 and the surface of the loaded clamping roller such that the rail edge remains in the groove. The elongated mask supporting frame 20 is held in fixed or clamped position within the recessed groove 126 to inhibit separation of the elongated mask supporting frame 20 from the guide rollers 120 and 122 during conveyance of the elongated mask supporting frame relative to the central guide rollers. Likewise, as the elongated mask supporting frame is transported relative to the remote guide rollers 256 and 258 of FIG. 9, the loaded clamping roller 130 of FIGS. 4 and 5 inhibits separation of the elongated mask supporting frame 20 from the appropriate central guide rollers 120 and 122.

Further, when the elongated mask supporting frame experiences crook types warpage, the edge of the rail 90 does not stay in the center of the recessed groove 126 but, in fact, rides upon and contacts the sloped edges of the central guide rollers 120 and 122 which define the groove. The loaded clamping roller 130 is sufficiently compliant to accommodate the variations in the elongated mask supporting frame 20 while clamping and holding the same in position as noted above. Also, when the elongated mask supporting frame 20 is supported by one central guide roller and one remote quide roller, the clamping roller 110 is sufficiently compliant to hold the rail 90 within the grooves and also permit the elongated mask supporting frame to bow while the rail 90 is still being held in the grooves.

As illustrated in FIGS. 2, 3 and 4, the support roller 110 and the central guide roollers 120 and 122 provide a three point suspension and support to moveably support the elongated mask supporting frame 20 as the same is conveyed along the direction of its elongation. The loaded clamping roller 130 cooperates with the central guide rollers 120 and 122 to hold the edge of the rail 90 within the recessed groove 126 of each of the central guide rollers 120 and 122 while enabling the edge of the rail 92 to move laterally on the outer cylindrical bearing surface of the support roller 110 during conveyance of the elongated mask supporting frame.

In the case of twist type warpage, when the elongated mask supporting frame 20 is in an off centered position, rails of the elongated mask supporting frame 20 will engage one or both of the central guide rollers 120 and 122, one of the remote guide rollers 256 and 258 and the support roller 110 in a manner similar to that enumerated in crook or bow type warpage.

Referring to FIGS. 3, 4 and 5, in the preferred embodiment the elongated mask supporting frame 20 has a translatably supported tooth rack 140 disposed along the outer surface of the rail 90 which is one of the pair of parallel rails 90 and 92. The translatably supported tooth rack 140 extends along the length of the elongated mask supporting frame between points slightly beyond the center of the two end mask positions. The translatably supported tooth rack 140 is selected to have a coefficient of thermal expansion which is substantially equal to that of the elongated mask supporting frame 20 and rail 90. The number of teeth in the tooth rack 140 located between the center line of each aperture remains the same during the expansion and contraction of the elongated mask supporting frame 20. Likewise the number of teeth on the periphery of the coupling gear 142 remain the same. Thus, the ratio of teeth in the tooth rack 140 relative to the number of teeth on the periphery of the coupling gear 142 remain the same even though the meshing capability therebetween varies as a function of temperature.

With the above construction, the engagement point between the tooth rack 140 and coupling gear 142 remains at substantially the same point and the position of the mask relative to the working station is not changed significantly and the number of aperture positions that the elongated mask supporting frame is translated is determined by the number of rotations of the coupling gear 142.

In the preferred embodiment, the coupling gear 142 is rotatably mounted with its axis substantially normal to the axis of the guide rollers 120 and 122 and extends vertically upward from and is equally spaced between the axis of the central guide rollers 120 and 122 and in spaced alignment with the axis thereof 120 and 122.

As shown in FIG. 3, the coupling gear 142 is located between the central guide rollers 120 and 122 and in opposed alignment with the working station to which the mask aperture 30 is indexed. With the coupling gear 142 so positioned, the lateral center of the mask aperture 30 will be indexed substantially at the lateral center of the working station regardless of the dimensional variation due to thermal expansion, contraction and distortion of the elongated mask supporting frame 20.

In the preferred embodiment, the coupling gear 142 is rotatably mounted so as to be engagedly disposed relative to the translatably supported tooth rack 140 such that rotation of the gear 142 causes the teeth formed in the periphery thereof to engage and selectively transport the tooth rack 140 and the elongated mask supporting frame 20 attached thereto relative to the support roller 110 and the central guide rollers 120 and 122 along the path in a direction of elongation of the elongated mask supporting frame.

In the preferred embodiment, the pitch diameter of coupling gear 142 and the number of teeth in the support tooth rack gear 140 between the apertures' centers is selected such that one revolution of rotation of the coupling gear 142 transports the elongated mask supporting frame along its path a distance equal to the distance between the center lines of two adjacent apertures 30.

FIG. 7 illustrates in greater detail the relationship between the elongated mask supporting frame 20, a mask 50 which is supported by the mask support assembly 52 and its position relative to the aperture 30 which extends from the upper surface 24 to the lower surface 26. The selected mask 50 has alignment targets 150 which are illustrated in greater detail in FIGS. 6(a) and (b). The alignment targets 150 provide a means for accurately aligning masks to each other. In FIG. 6(a), the mask support assembly 52 includes a plurality of pins for aligning the masks to a gantry means 60 shown as 170, 172 and 174. In addition a plurality of monitoring apertures have either the monitoring shield tube such as monitoring shield tube 156 mounted therein or a plurality of cover members covering the apertures such as aperture covers 158, 160 and 162.

FIGS. 7 and 8 show details of the alignment pins located on the mask support assembly 52 and the alignment and receiving means 62, 64 and 66.

FIG. 7 shows the elongated mask supporting frame 20 having the upper surface 24 and the lower surface 26. A mask frame support housing 54 cooperates with the mask frame support 52 to support a mask 50 relative to the aperture 30 in the elongated mask supporting frame 20 and to minimize the thermal conductivity of the assembly 50 and 52 and the elongated mask supporting frame 20. Mask frame support housing 54 is attached to elongated mask support frame 20. The locking ring 180 contains shielding tube 42 between the elongated mask supporting frame 20 and mask frame support housing 54. Housing 54 provides rotational constraint of 52 through a pin and a notch arrangement. The mask frame support housing 54 supports the mask frame support 52 and the shielding tube 42 holds the mask frame support 52 concentric.

In FIG. 7, two alignment pins are illustrated, pins 170 and 174. Since FIG. 7 is a sectional view, pin 172, illustrated in FIG. 6(a) is not shown but forms a third pin for the three pin alignment system.

FIG. 8 illustrates one embodiment of a gantry means 60 for supporting a substrate relative to the mask 50. Pin receiving means 62, 66 and 64 are adapted to make mating engagement with pins 170, 172 and 174 respectively. A substrate support housing is adapted to support the substrate 70 in a secure stable position. A support platform 202 supports the substrate housing 200 through three flexible chain members 204. An intermediate plate 206 may be used as a heat shield and as a support for other components such as electrical connectors if required in the gantry means.

When the gantry means 60 as illustrated in FIG. 8 is positioned relative to the mask support assembly 52 containing aligned pins, the aligned pins cooperate with the pin receiving means to permit the housing 200 to nestle into proper alignment between the pin receiving means and the pins such that the substrate 70 is accurately registered relative to mask 50. It is desirable to have prealigned the alignment pins relative to the alignment pin receiving means in the housing to insure accurate registration between the various masks each time the gantry is positioned relative to the masks 50. The target 150 is used to establish this pin prealignment between the various masks to insure the deposited patterns from said masks have the proper registration one to another.

FIG. 9 illustrates pictorially the method for transporting the elongated mask supporting frame 210 through a plurality of various positions. FIG. 9 illustrates the elongated mask supporting frame 210 as having four sections, namely Sections 212, 214, 216 and 218. For purposes of illustration, Section 212 is shown to have one aperture 220 located at the far right end thereof and Section 218 is shown to have aperture 230 at the far left end thereof. A translatably supported tooth rack 260 is disposed along the elongated mask supporting frame in order to transport the same such that the aperture from a specific section is positioned within a work area 234. A coupling gear 262 cooperates with the translatably supported tooth rack 260 such that controlled rotation thereof drives the tooth rack 260 and subsequently the elongated mask supporting frame to selectively position a selected mask of a plurality of masks within the work area 234. In the embodiment illustrated in FIGS. 9(a), (b) and (c), the pitch diameter of the coupling gear 262 is selected such that one revolution of the coupling gear 262 transports the elongated mask supporting frame 210 a distance equal to the distance between the center lines of two adjacent apertures.

In FIG. 9(a), the elongated mask supporting frame 210 is shown in its centered position when no apertures are positioned within the work area 234. In the embodiment illustrated in FIG. 9(a), the first pair of central guide rollers 120 and 122 are positioned relative to the supporting roller 110 to completely support the elongated mask supporting frame. The elongated mask supporting frame 210 is in a stable equilibrium condition of balance at this point. A second set or remote guide rollers having grooved recesses therein are illustrated as 256 and 258 and are located relative to the coupling gear 262 and the support roller 110 such that movement of the elongated mask supporting frame 210 to the right or left of the center position as shown in FIG. 9(a) results in one of the second set of remote guide rollers 256 or 258 providing additional support for the elongated mask supporting frame 210.

FIG. 9(b) illustrates the relationship between the elongated mask supporting frame 210 when aperture 230 which is located at the left hand side of Section 218 is positioned within working area 234. Central guide rollers 120, and 122 cooperate with support roller 110 to support the aperture 230 within the work area 234. Remote guide roller 258 is positioned so that its axis is in parallel spaced alignment with the axes of central guide rollers 120 and 122 and the distance between the axis of central guide roller 122 and the axis of remote guide rollers 258 is selected such that the remote guide roller 258 engages rail 90 and provides additional support when the elongated mask supporting frame 210 is moved a slight distance to the right from the center position illustrated in FIG. 9(a). The distance between the center line of a central guide roller and its adjacent remote guide roller is selected such that rail 90 does not engage its associate remote guide roller 256 or 258 when the elongated mask supporting frame is in its center position and the rail 90 is at its maximum possible length due to thermal expansion, warpage and the like.

FIG. 9(c) illustrates the elongated mask supporting frame in a position where aperture 220 which is located to the extreme right hand side of Section 212 is positioned within the work area 234.

In the position illustrated by FIG. 9(c), guide rollers 120 and 122 and support roller 110 provide support for the elongated mask supporting frame 210 in the vicinity of the work area 234. Remote guide roller 256, which is located left of central guide roller 120, has its axis in spaced parallel relationship with the axis of central guide roller 120. The spacing of the axis of remote guide roller 256 relative to the axis of the central guide roller is determined using the same criteria set forth with respect to FIG. 9(b).

As noted hereinbefore, when the elongated mask supporting frame 210 is in the position illustrated in FIGS. 9(b) and 9(c) it is subject to thermal expansion and warping. In the event that the elongated mask supporting frame 210 became so bowed and twisted that only one of the central guide rollers 120 or 122 may engage the guide rail 90 on the elongated mask supporting frame 210, a three point suspension and support is provided to the elongated mask supporting frame 210 by at least one of the central guide rollers 120 and 122, one of the remote guide rollers 256 or 258 and the support roller 110. An additional support may be provided in the form of a loaded clamping roller 130 illustrated as clamping roller 130 in FIGS. 4 and 5.

In the embodiment illustrated in 9(a), 9(b) and 9(c,) the rail 90 which is located on the underside of the elongated mask supporting frame 210 is maintained in a reference line which is defined by the centers of the grooved recessed areas and each of central guide rollers 120, 122, and remote guide rollers 256 and 258, either individually or in combination. During heating of the elongated mask supporting frame, the entire frame is subject to expansion, warping or growth along the width and length thereof. Expansion of the dimension of the elongated mask supporting frame in a direction which is parallel to the axis of the guide rollers results in the rail 92 located on the side of the elongated mask supporting frame opposite to that supported by the guide rail 90 which is in contact with and rotatably supported by the outer cylindrical surface of support roller 110, moving outward on the outer cylindrical surface which does not restrain or otherwise fix the outer rail. In this manner, any warping, increase in length, or increase in width due to expansion by heating is compensated for by the carriage assembly such that when an aperture is positioned within the work area 234, the three points of support are provided therein by guide rollers 120, 122, support roller 110, and possibly guide rollers 256 or 258. When the rail 90 is engaged in remote guide roller 256 or 258 and the carriage and rail 90 has a curvature formed therein due to warpage or bending, that is in the plane of the elongated mask supporting frame 210, the rail 90 will engage one beveled side of central guide roller 120 and the other beveled side of central guide roller 122. The net result thereof is for the central guide rollers 120 and 122 to act effectively as a single guiding device with the depth of engagement (mesh) of the rack 140 and the gear 142 remaining effectively the same as if rail 90 were straight and seated in the bottom of the grooves 126 of central guide rollers 120 and 122.

If rail 90 has curvature that lies normal to the plane of the elongated mask supporting frame 210, and the rail 90 is engaged in guide rollers 256 or 258, then only one of the central guide rollers 120 or 122 will be engaged to guide rail 90. In addition, the clamping roller 130 such as that illustrated in FIGS. 2, 4 and 5 can be used to insure that the elongated mask supporting frame is held within the grooves of the grooved central guide rollers 120 and 122. As noted herein with respect to the central guide rollers 120 and 122, the grooved surface may be located on the elongated mask supporting frame and a protruding lip may be located on the periphery of the remote guide rollers 256 and 258 as well as on the periphery of the central guide rollers 120 and 122.

Figure 10:
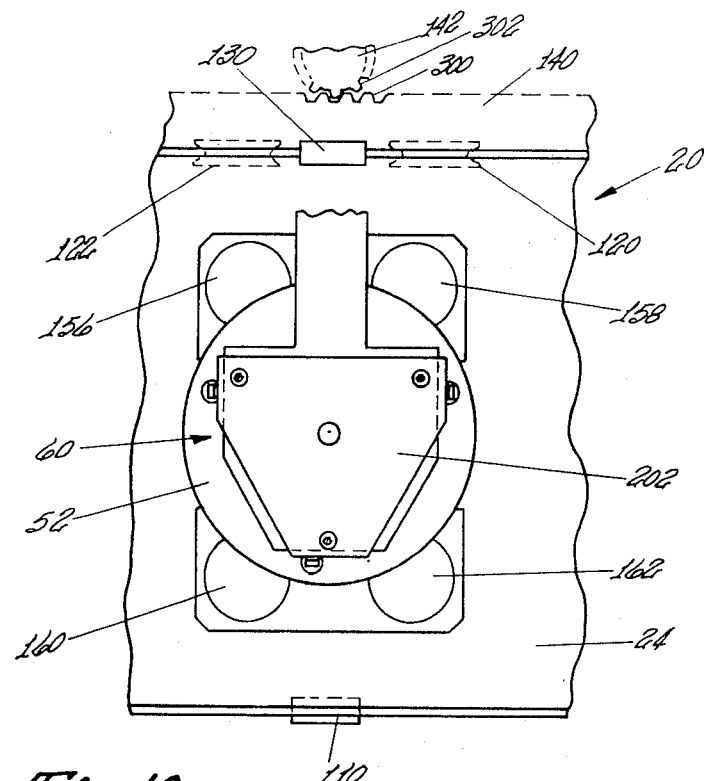
FIG. 10 is a partial top plan view of the means for accurately registering a substrate to a mask located in an aperture which is selectively positioned in the work station.

FIG. 10 illustrates in greater detail an assembled gantry means 60 which is mounted on and accurately registered with a mask frame assembly 52 containing a mask 50. Alignment pin receiving means 62, 66 and 64 shown in FIG. 8 cooperate with the alignment pins in the mask support assembly illustrated in FIGS. 6 and 7. The elongated mask supporting frame 20 includes a translatably supported tooth rack 140 which cooperates with coupling gear 142. The translatably supported tooth rack 140 has a plurality of spaced teeth 300 located along the edge thereof which are adapted to cooperate with teeth 302 located in the periphery of coupling gear 142. As noted herein, in this embodiment, one revolution of the coupling gear 142 results in transporting the translatably supported tooth rack 140 a distance equal to the distance between two center lines of two adjacent apertures located on the elongated mask supporting frame 20. The central guide rollers 120 and 122 are dashed in to show their position relative to the clamping roller 130 and the coupling gear 142 and support roller 110 is shown with its axis perpendicular with the axis of coupling gear 142 as shown in FIG. 4.

In FIG. 10, monitoring apertures 156, 158, 160 and 162 are illustrated to show their positions relative to the gantry means in its assembled relationship with the mask support assembly 52. In FIG. 10, the gantry means 60 is positioned in accurate registration position with a mask through the alignment pin receiving means 62, 64 and 66 which are shown in FIG. 8. The elongated mask supporting frame 20 is supported at three points by central guide rollers 120, and/or 122, and 110 when centered and is additionally supported when off center by remote guide rollers 256 or 258. The clamping roller 130 insures that elongated mask supporting frame 20 is intimately held in position thereagainst.

Figure 11:
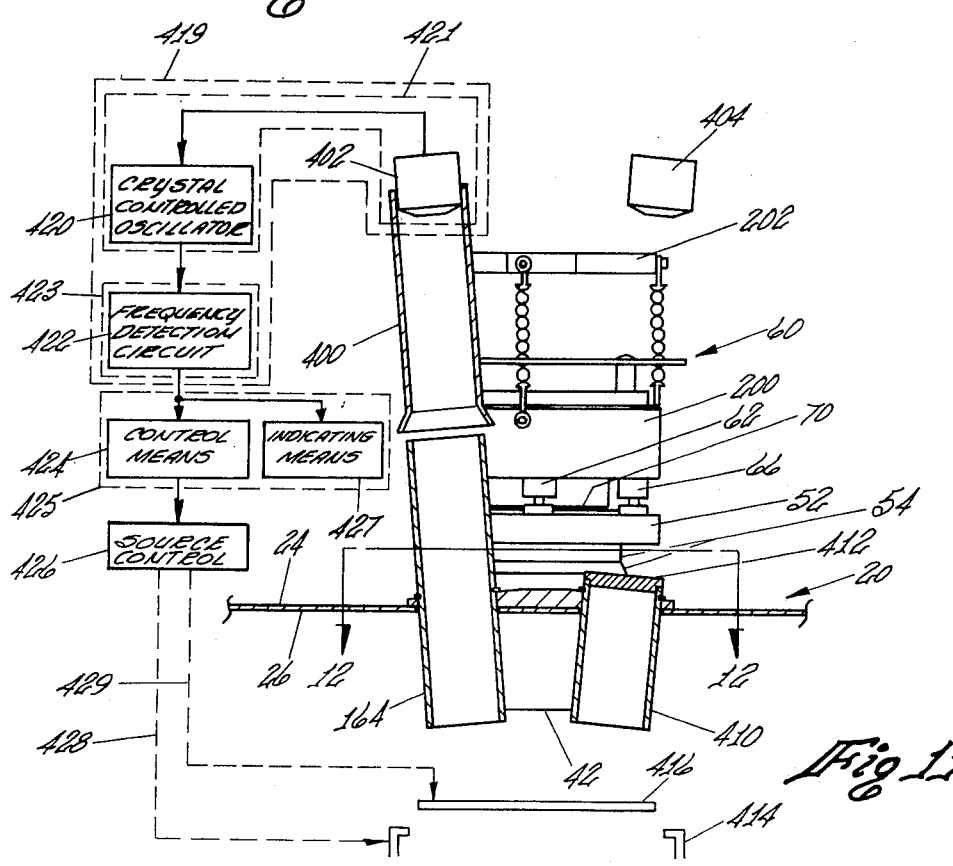
FIG. 11 is a side plan view partially in cross-section and partially diagrammatic showing a monitoring tube and means for monitoring deposition of a layer of material on a substrate through the mask at a working station.

The apparatus of FIGS. 10 and 11 are adapted for sensing deposition of a thin film layer of a material from a source onto a substrate 70. The apparatus comprises means including means, such as carriage means 20, for defining a predetermined number of apertures 156, 158, 160 and 162 for selectively passing predetermined portions of a material from a source 414 along each of a plurality of predetermined paths located in the proximity of a substrate 70 under conditions correlated to that under which a material is deposited through a deposition path in a thin film layer onto the substrate 70. The apparatus includes means positioned relative to the selectively passing means for selectively inhibiting passage of a predetermined portion of the material through each of a selected number of the predetermined number of apertures.

FIG. 11 illustrates, partially in cross-section, a typical monitoring shield tube 164 which is adapted to pass the material to the surface of a detector 402 through an upper monitoring shield tube 400. In the preferred embodiment, the monitoring means 419 includes a detecting means 421 and circuit means 423. The detecting means, shown as dashed box 421, includes a detector 402 and an oscillating means, such as crystal controlled oscillator 420. The oscillating means is operatively coupled to each of the detecting means for generating an electrical signal therefrom. The frequency of the electrical signals is a function of the characteristics of the mass per unit area of the thin film layer of material collected on the detector 402 detecting surface. Specifically, the detector 402 varies the frequency of the electric signal in a predetermined manner as a function of the selected parameter of the material forming the thin film layer. The conditions under which detector 402 collects the vapor deposited material are selected so that they can be correlated to that of the proximate substrate 70.

Circuit means, shown by dashed rectangle 423, in the preferred embodiment is a frequency detection circuit 422 which is operatively coupled to each of the oscillator means for each detector. For example, oscillator 420 is connected to detector 402, for detecting a change in frequency of each crystal and for producing information signals representative of at least one of the mass per unit area, thickness or deposition rate of the material so detected.

A programmable control means, shown by dashed rectangle 425, in the preferred embodiment includes a control means 424 which is operatively coupled to the circuit means 423, such as frequency detection circuit 422, for receiving the information signals. The control means 424 produces one or more control signals from the information signals and the control signals are used to control and process variables in the vapor deposition process. In addition, the information signals are utilized as an input for an indication means 427.

The output from the control means 424 may be applied to an output circuit, such as source control 426. The source control 426 is adapted to control the material source 414 via control 428 or to control a shutter 416 between the source 414 and mask shield 42 by mechanism 429.

The enabling of a monitor shield tube 164 to pass the material is shown in FIG. 11. The material passes through monitor shield tube 164 and upper monitor shield tube 400 in detector 402.

The inhibiting of a monitor opening is illustrated by blocked monitor shield tube 410 having a cap 412 to prevent passage of material to different detectors, such as detector 404.

As noted above, the circuit means 423, which in the preferred embodiment is a frequency detection circuit 422, can be characterized as a portion of the means for monitoring a selected parameter of a thin film material which is passed through other than the selected number of the predetermined number of the apertures of the selectively passing means. The monitoring means 419 includes detectors 402 and 404 which are positioned along each of the plurality of predetermined paths and are adapted to sense a predetermined portion of the thin film material being passed along its associated predetermined path and for producing electrical signals derived from the selected parameter of the thin film material so detected representing at least one of the mass per unit area, thickness and deposition rate of a said thin film of material.

As illustrated in FIG. 11, the monitoring means 419 also includes circuit means 423 which are responsive to the electrical signals from the detecting means 421 for processing the electrical signals received therefrom to produce information signals in a predetermined format representing at least one of the mass per unit area, thickness and deposition rate of the material so detected.

The apparatus of FIG. 11 further comprises programmable control means 425 which includes a control means 424 operatively coupled to the circuit means 423. The programmable control means 425 is responsive to the information signals to produce at least one control signal which is adapted to control the source of material for producing at least one of a predetermined mass per unit area, thickness and selected deposition rate of the material.

The apparatus of FIG. 11 illustrates that the programmable control means 425 includes means responsive to the information signals, such as indicating means 427, for indicating when the detected material attains at least one of a selected mass per unit area, a selected thickness and a selected deposition rate which is representative of the same characteristic of the material deposited in a thin film layer onto a proximate substrate.

The apparatus of FIG. 11 includes one embodiment of a detecting means 421. The detecting means 421 may include a surface for collecting a thin film layer of material thereon. Also, the circuit means 423 would include means for measuring the resistance of the thin film layer of material collected on the detecting means surface and producing electrical signals representative of the resistance thereof. The resistance varies in magnitude as a function of the characteristic of at least one of the mass per unit area and thickness of a thin film layer of material collected on the detecting means surface.

Circuit means 423 are operatively coupled to each of the resistance measuring means and are responsive to the electrical signals for detecting a change in resistance of each thin film layer of material deposited onto the detecting means surface and for producing the information signals derived from the resistance of the thin film layer of material deposited on the detecting means surface. The information signals are representative of the characteristic of at least one of the mass per unit area, thickness and deposition rate of said material deposited in a thin film layer onto the proximate substrate 70.

The programmable control 425 means would include control means operatively coupled to each of the resistance detecting means for receiving information signals and producing therefrom at least one control signal representative of a selected at least one of said mass per unit area, thickness and deposition rate of said material being deposited onto said detecting means surface. The operation of the detecting means is correlated to the same conditions as that under which the material is deposited in a thin film layer onto the proximate substrate 70. The control signal would then be utilized as stated hereinbefore.

In addition, means responsive to the information signals would indicate that a thin layer of material of a selected at least one of a mass per unit area, thickness and a selected deposition rate has been deposited on the detecting means surface which is representative of the same characteristic of the material deposited in a thin film layer onto the proximate substrate 70.

Also, the apparatus of FIG. 11 could utilize a detecting means which includes an optical sensing means and means for measuring the optical characteristics of material sensed by the optical sensing means and for producing electrical signals representative of the optical characteristics thereof. The optical characteristics of the optical sensing means vary as a function of the deposition characteristic of material sensed thereby.

Circuit means operatively coupled to the optical characteristic measuring means and responsive to the electrical signals would include means for detecting a change in optical characteristics of the material sensed by the optical sensing means and for producing information signals derived from selected optical characteristics of the material. The so-produced information signals would be representative of a selected at least one of the mass per unit area, thickness and deposition rate of a thin film layer deposited onto the proximate substrate 70.

The programmable control means would include a control means which is operatively coupled to the circuit means, which includes the optical detecting means, for receiving the information signals and for producing therefrom at least one control signal representative of a selected at least one of said mass per unit area, thickness and deposition rate of the material which is correlated to the same conditions as that under which said thin film layer of material is deposited onto a said proximate substrate 70. The control signal would then be utilized as stated hereinbefore.

Means would be included which are responsive to the information signals for indicating that material deposited in a thin film layer onto a said proximate substrate has attained a selected at least one of a mass per unit area, thickness and a selected deposition rate.

Another embodiment of the apparatus of FIG. 11 would comprise a detecting means which includes means for sensing vapor density of the predetermined portion of material in a vapor phase passing along each predetermined path and for producing electrical signals representative of the vapor density of the material passing along each predetermined path.

The circuit means would include means operatively coupled to said vapor density sensing means for receiving the electrical signals and for producing said information signals representing at least one of the mass per unit area, thickness and deposition rate of a thin film of material which is correlated to the same conditions as that under which the thin film of material is deposited onto a said proximate substrate 70.

The programmable control means would include control means operatively coupled to the circuit means for receiving the information signals and producing therefrom at least one control signal representative of a selected at least one of the mass per unit area, thickness and deposition rate of a thin film of material deposited in a thin film layer onto the proximate substrate 70. The control signal can be utilized as stated hereinbefore.

Means are responsive to the information signals for indicating that a detected quantity of material has passed along the predetermined path which is representative of material forming a thin film layer of a selected at least one of a mass per unit area, thickness and selected deposition rate which has been deposited in a thin film layer onto the proximate substrate 70.

Figure 12:
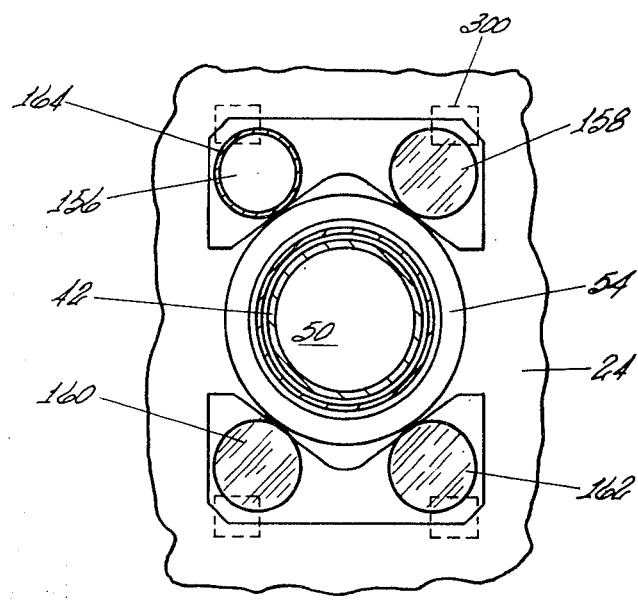
FIG. 12 is a partial top plan view partially in cross section illustrating the mounting of a mask within an aperture of an elongated mask supporting frame, a plurality of monitoring tube apertures located around the mask support aperture and means for selectively passing a portion of the vapor deposition along a selected monitoring tube.

Referring to FIG. 12, a top plan view partially in cross section shows the mask shield 42, the mask frame support housing 54, and the monitoring shield tube 164. The other three monitoring apertures 158, 160 and 162 are capped such that vapor from the vapor deposition can pass through monitoring shield tube 156 only.

By use of the monitoring shield tube 164 and monitoring shield tube cap selection technique as illustrated in FIG. 12 above, a specific deposition thickness monitoring device can be selected as a function of a specific monitoring shield tube in association with a specific mask positioned at a vapor deposition working station located along the deposition path between a source and a substrate. The monitoring devices, shown by dashed rectangles 300, are located above the plane illustrated in FIG. 12.

FIGS. 13(a), 13(b) and 13(c) illustrate an example of how a specific detector can be associated with a specific mask.

FIG. 13(a) shows mask 464 in a section 460 of an elongated mask supporting frame having monitor tube 472 and 476 enabled with monitor tube section 470 and 474 inhibited.

FIG. 13(b) shows mask 466 in a section 461 of an elongated mask supporting frame having monitor tube 570 enabled with monitor tube section 572, 574 and 576 inhibited.

FIG. 13(c) shows mask 468 in a section 462 of an elongated mask supporting frame having monitor tube 674 enabled and monitor tube section 670, 672 and 676 inhibited.

In this manner, four separate detectors can be used and a specific detector, or two detectors or more, if redundancy is important as in FIG. 13(a), can be allocated to a specific mask.

Figure 13:
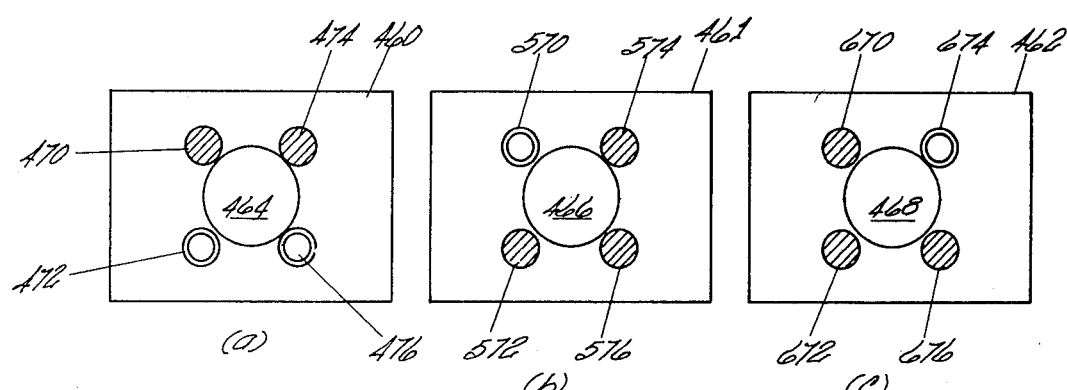
FIG. 13 is a pictorial representation of three programmed arrangements wherein one or more monitoring tubes are located in the monitoring apertures located adjacent the mask aperture for selecting a specific monitor in association with a specific mask position in a vapor deposition device.

The carriage assembly as illustrated in FIGS. 12 and 13 inherently programs the array of detector relative to the plurality of deposition masks such that when a specific deposition mask is transported to the working stage, the appropriate detector is automatically enabled and receives the material.

In the preferred embodiment of the present invention, the carriage assembly for indexing a selected mask from a plurality of masks is adapted for use with a vapor deposition source which is located at a working stage. However, it is envisioned and anticipated that the carriage assembly hereof has wide application in all types of deposition systems including, without limitation, sputtering systems, chemical vapor deposition systems, plating techniques and the like.

In addition, it is envisioned that one or more gantry means could be used so that parallel deposition of a layer onto a substrate can occur so that one or more masks and/or substrates are utilized or that one or more working areas are provided during each deposition step.

Of importance is the fact that the elongated mask supporting frame provides a means for providing a coarse indexing of an aperture, mask assembly and associated monitoring tubes relative to a source and that the precise final accurate registering is obtained by aligning the gantry means with the substrate relative to the mask. Prior to the deposition process, it is anticipated that each of the masks would be prealigned to the gantry means such that accurate registration would occur between the gantry means and the mask at any location and when any mask is positioned within the working station.

In addition, it is possible that one of the layers being deposited during the vacuum deposition could be a magnetic layer which could form pole pieces for a thin film magnetic transducer. In such event, it is desirable to preorientate the magnetic means within the magnetic material during deposition thereof. FIG. 2 illustrates that one or more sections of the elongated mask supporting frame 20 could include a set of parallel spaced aligned magnets 700 and poles 88 to provide the desired magnetic orientation in the magnetic domains. Of course, the spaced parallel aligned magnets 700 and poles 88 could be located selectively within any section of the elongated mask supporting frame as desired. In utility, a wide range of thin film deposited components can be fabricated using the teachings of this invention. The preferred embodiment of the present inventin is to form thin film magnetic transducers which require precisely aligned pole pieces, windings, layers and the like. However, it is possible to fabricate other lesser components such as capacitors, resistors, inductors, transformers and combinations of these components using the multi-step, multi-mask technique including the use of the unique carriage assembly disclosed herein.

In a multi-step deposition process where a large number of thin films of different materials are to be deposited, it is anticipated that one monitoring aperture, its associated monitoring tube path and detector may be used for each material. Also, when redundancy, accuracy and control are important, two separate detectors, with two separate monitoring apertures and their associated monitoring tube paths may be utilized. In addition, if the number of monitoring apertures are less than the desired number of different thin film materials to be deposited, one of the detectors may be used for monitoring the mass per unit area, thickness or deposition rate of more than one material. This is accomplished by correlating the effects of the two different materials collected on the detector to the actual deposition conditions that the same materials are collected on a substrate. Further, if one mask is used for depositing two different materials on a substrate, and two separate detectors are utilized, a shutter mechanism may be used to enable the appropriate monitoring path to the appropriate detector.

It is also envisioned that other techniques be used to increase the reliability, registerability and other effects of the mask substrate interface by providing means for stabilizing the mask and substrate during deposition to minimize misregistration due to the effects of thermal expansion and uncontrolled variables.

The preferred embodiment of the present invention provides for the use of four detectors in a predetermined array to monitor production of a thin film magnetic transducer in a multi-step vapor deposition process.

The method of selectively inhibiting material from passing along a predetermined path to a detector for each step of the multi-step process permits the fabrication of a thin film magnetic transducer or other deposited devices formed of a plurality of layers of different material to have an overall thickness which clearly exceeds the thickness of a film of material which could be deposited on only one of the detectors. Thus, by use of a plurality of detectors, the operating range of any one detector, which is a function of the thickness of film formed thereon, will not be exceeded in the deposition process.

Further, individual detectors can be dedicated to a specific material or combination of matreials to avoid undesirable effects which would otherwise occur from use of a single detector with layers of multiple material being deposited and relying on that single detector for process monitoring and control.

What is claimed is:

1. A method of measuring at least one of a mass per unit area, thickness or deposition rate of a thin film material applied to a substrate through a deposition mask selected from a plurality of deposition masks adapted to be individually positioned along a deposition path between a substrate and a source comprising the steps of forming a plurality of predetermined monitoring apertures in a carriage means adjacent each of said plurality of deposition masks supported thereby wherein each predetermined monitoring aperture is adapted to pass therethrough a predetermined portion of a said thin film material which is the same as that passed from a thin film material source through a selected deposition mask positioned between a said source of thin film material and a said substrate;

selectively inhibiting the passage of a predetermined portion of a said thin film material through a selected number of said plurality of said monitoring apertures;

passing at least one of said plurality of predetermined portions of a said thin film material along at least one of a plurality of associated predetermined paths;

positioning a plurality of detecting means one each along each of said predetermined paths such that a selected one of said plurality of detecting means is positioned along a selected one of said plurality of predetermined paths for sensing the predetermined quantity of material being passed along its associated predetermined path; and producing with a circuit means responsive to the detecting means information signals representative of at least one of the mass per unit area, thickness and deposition rate of a thin film layer of material sensed by said detecting means.

2. The method of claim 1 further comprising the step of producing a control signal from said information signal which controls the material passing along said deposition path.

3. The method of claim 1 further comprising the step of programming at least one of a predetermined monitoring aperture and preselected detecting means to a deposition mask in a carriage means by inhibiting the passage of predetermined portions of a said thin film material in a predetermined array for each deposition mask to permit each deposition mask to have at least a preselected monitoring aperture, predetermined path and preselected detecting means associated therewith.

4. A method of measuring at least one of a mass per unit area, thickness or deposition rate of a thin film material applied to a substrate through a deposition mask selected from a plurality of deposition masks adapted to be individually positioned along a deposition path between a substrate and a source comprising the steps of forming a plurality of selectively passing and selectively inhibiting means in a supporting means adjacent each of said plurality of deposition masks supported thereby wherein each selectively passing means is adapted to pass therethrough a selected predetermined portion of a said thin film material which is the same as that passed from a thin film material source through a selected deposition mask positioned between a said source of thin film material and a said substrate;

moving the supporting means into a selected position relative to said deposition path to position said selectively passing means relative to said predetermined portions of a said thin film material;

passing at least a selected one of said plurality of predetermined portions of a said thin film material along at least one of a plurality of associated predetermined paths;

positioning a plurality of detecting means one each along each of said predetermined paths such that a selected one of said plurality of detecting means is positioned along a selected one of said plurality of predetermined paths for sensing the predetermined quantity of material being passed along its associated predetermined path; and producing with a circuit means responsive to the detecting means information signals representative of at least one of the mass per unit area, thickness and deposition rate of a thin film layer of material sensed by said detecting means.

* * * * *